US008492978B2

(12) United States Patent
True

(10) Patent No.: US 8,492,978 B2
(45) Date of Patent: Jul. 23, 2013

(54) DUAL ELEMENT SWITCHED ELECTRON GUN

(75) Inventor: Richard Brownell True, Sunnyvale, CA (US)

(73) Assignee: L-3 Communications Corporation, San Carlos, CA (US)

( * ) Notice: Subject to any disclaimer, the term of this patent is extended or adjusted under 35 U.S.C. 154(b) by 267 days.

(21) Appl. No.: 12/873,979

(22) Filed: Sep. 1, 2010

(65) Prior Publication Data

US 2011/0062898 A1    Mar. 17, 2011

Related U.S. Application Data

(60) Provisional application No. 61/242,308, filed on Sep. 14, 2009.

(51) Int. Cl.
*H01J 7/44*   (2006.01)

(52) U.S. Cl.
USPC .................... 315/48; 315/94; 315/105

(58) Field of Classification Search
USPC ................. 315/32, 48, 94, 105, 362
See application file for complete search history.

(56) References Cited

U.S. PATENT DOCUMENTS

| 4,247,801 | A | * | 1/1981 | Dallos et al. ................. 315/107 |
| 4,323,853 | A | | 4/1982 | Kurokawa |
| 4,638,215 | A | | 1/1987 | Schmid |
| 5,744,919 | A | | 4/1998 | Mishin |
| 6,326,730 | B1 | * | 12/2001 | Symons ..................... 315/5.39 |
| 2004/0104682 | A1 | * | 6/2004 | Horsky et al. ............ 315/111.81 |

FOREIGN PATENT DOCUMENTS

| EP | 1814134 A2 | 8/2007 |
| WO | WO/85/00074 A1 | 1/1985 |
| WO | WO/00/30145 A1 | 5/2000 |

* cited by examiner

*Primary Examiner* — Thuy Vinh Tran
(74) *Attorney, Agent, or Firm* — O'Melveny & Myers LLP

(57) ABSTRACT

The invention provides an apparatus and method of switching more than one bias voltage within an electron beam tube in order to achieve electron beam cutoff. The invention is particularly useful for high-perveance electron tubes in which a large change in focus-electrode-to-cathode or anode-cathode voltage might otherwise be needed to achieve cutoff. In one embodiment of the invention, the cathode and anode bias voltages are both switched by magnitudes well within the capabilities of standard high-voltage switches to achieve beam cutoff.

22 Claims, 14 Drawing Sheets

DUAL ELEMENT SWITCHED ELECTRON GUN

RELATED APPLICATIONS

This application claims the benefit under 35 U.S.C. §119 (e) of U.S. Provisional Application No. 61/242,308, filed Sep. 14, 2009.

BACKGROUND OF THE INVENTION

1. Field of the Invention

The present invention pertains to the field of electron beam tubes and more particularly to an ungridded electron gun having an electrically isolated focusing electrode and a modulating anode.

2. Description of Related Art

In travelling wave tubes (TWTs) used in microwave power modules, it is desirable to be able to selectively shut off the electron beam current or at least reduce its magnitude to a tolerably low level. This can be accomplished by switching the focusing electrode of the electron gun to a voltage potential that is negative with respect to the cathode. Alternatively, the cathode voltage potential can be switched towards ground in order to establish a negative bias on the cathode with respect to the focusing electrode. In a typical modulating anode electron gun, the anode is generally switched from essentially ground potential to a potential approximately equal to the cathode potential, thereby reducing the electron beam current effectively to zero.

However, many electron guns are designed to exhibit a high perveance, which is defined as the ratio of the space-charge-limited beam current to the gun cathode-to-anode voltage raised to the three halves power. A higher perveance thus indicates that the emitted electron beam is more heavily influenced by space-charge effects. In such a system, the voltage that must be applied to the focusing electrode in order to completely cut off the beam current becomes unacceptably large. For example, FIG. 1 is a plot of a normalized focusing electrode cutoff voltage as a function of anode microperveance. The open circles, e.g., 110, are measured cutoff voltage ratios of various electron guns having different microperveance values. The microperveance of a given electron gun is a function of its geometry. It can be observed from FIG. 1 that the relationship of the cutoff voltage ratio to the microperveance is quite linear. This linear relationship is illustrated by curve 102, which is an empirical fit to the measured cutoff ratios of several different electron gun designs. A linear fit 106 to the data, shows that the normalized cutoff voltage is related to microperveance by a ratio of approximately 0.44. Thus, as the anode microperveance approaches a value of 2.1, the voltage that must be applied to the focusing electrode approaches the level of the cathode-to-anode voltage itself. Switching a voltage of this magnitude, which may be several thousand volts, poses a difficult challenge because modern solid-state voltage switches cannot easily handle voltage magnitudes greater than approximately 2000 volts. Thus, it would be desirable to provide a system for switching voltages within a high-perveance electron gun to achieve full beam cutoff while overcoming the difficulties of switching high-magnitude voltages described above.

SUMMARY OF THE INVENTION

The invention provides an apparatus and method of switching one or more bias voltage within an electron beam tube in order to achieve electron beam cutoff. In a first embodiment of an electron beam tube in accordance with the present invention, an electron beam tube comprises a tube body and a cathode mechanically affixed to the tube body through an insulating element, wherein the cathode is adapted to emit an electron beam at an operating electron beam current. The cathode is further connected to a cathode bias circuit adapted to apply a cathode bias voltage to the cathode. The electron beam tube further includes an anode mechanically affixed to the tube body through an insulating element wherein the anode is connected to an anode bias circuit adapted to apply an anode bias voltage to the anode. The electron beam tube further includes a focusing electrode mechanically affixed to the tube body through an insulating element wherein the focusing electrode is connected to a focusing electrode bias circuit adapted to apply a focusing electrode bias voltage to the focusing electrode. The electron tube includes a switching mechanism that may comprise a plurality of individual switches in some embodiments or a single switch in other embodiments. The switching mechanism is adapted to switch the bias voltage applied to at least one of the cathode, the anode, or the focusing electrode. As a result of actuating the switching mechanism and changing the selected bias voltage or voltages, the electron beam current drops from its operating current to a current that is substantially equal to zero.

In one particular embodiment of an electron tube in accordance with the present invention, the switching mechanism is implemented as a single switch configured to switch a floating power supply that may be connected to multiple ones of the cathode bias circuit, the anode bias circuit, and the focusing electrode bias circuit.

In another embodiment of an electron tube in accordance with the present invention, the electron tube is configured to operate at a microperveance that is greater than approximately 0.8. Two exemplary embodiments described in detail below discuss an electron gun with a microperveance of 0.87 and an electron gun with a microperveance of 2.0. While the invention is particularly useful for electron guns operating at high perveance, it applies equally to a gun of any perveance value.

In an embodiment of an electron gun in accordance with the present invention, the switching mechanism is configured to switch one or more voltages by a magnitude of less than approximately 2000 volts while still achieving cutoff of the electron beam. A typical system may have a maximum voltage magnitude of approximately 7500 volts applied to any of the cathode, anode, or focusing electrode during normal operation. Thus, this means that the switching mechanism is configured to switch voltages of a magnitude less than roughly one third of the maximum bias voltage employed during normal operation. The invention would similarly be applicable to electron guns having a maximum operating voltage other than 7500 volts, and the switching mechanism would accordingly operate to provide beam cutoff by switching voltages smaller than roughly one third of the maximum operating voltage.

In one embodiment of an electron gun in accordance with the present invention, the switching mechanism is configured to switch the cathode bias voltage and the anode bias voltage. Typically, upon actuation of the switching mechanism, the cathode will be switched to a voltage that is less negative and the anode will be switched to a voltage that is more negative than in normal operating mode. Thus, the voltage difference between the cathode and anode will decrease to a sufficient extent, and electron beam cutoff will be achieved. In some embodiments, the magnitude by which the cathode and the anode are switched will be equal. In other embodiments, the cathode and anode may be switched by different magnitudes.

In another embodiment of an electron gun in accordance with the present invention, the switching mechanism is configured to switch the anode bias voltage and the focusing electrode bias voltage. The magnitudes of the voltages by which the anode and focusing electrode are switched may be equal to one another or may differ. Typically, the focusing electrode and the anode will both be switched such that their biases become more negative in order to achieve electron beam cutoff.

In another embodiment of an electron gun in accordance with the present invention, the switching mechanism is configured to switch the cathode bias voltage and the focusing electrode bias voltage. Again, the magnitudes of the voltages by which the cathode and focusing electrode are switched may be equal to one another or may differ.

In still another embodiment of an electron gun in accordance with the present invention, the switching mechanism may be configured to switch the voltage biases applied to all three of the cathode, the anode, and the focusing electrode. The magnitudes by which each bias is switched may or may not be equal to each other.

In some embodiments of an electron gun in accordance with the present invention, the electron gun may further include a collector unit configured to collect the spent electron beam. The collector may comprise a multistage depressed collector having one or more stages that are depressed in voltage potential with respect to the tube body.

Those skilled in the art will recognize other benefits and applications of the disclosed invention, and such would also fall within the scope and spirit of the present invention. A detailed description of the preferred embodiments follows with reference to the attached sheets of drawings, which will first be described briefly.

DETAILED DESCRIPTION OF THE PREFERRED EMBODIMENT

Figure 1:
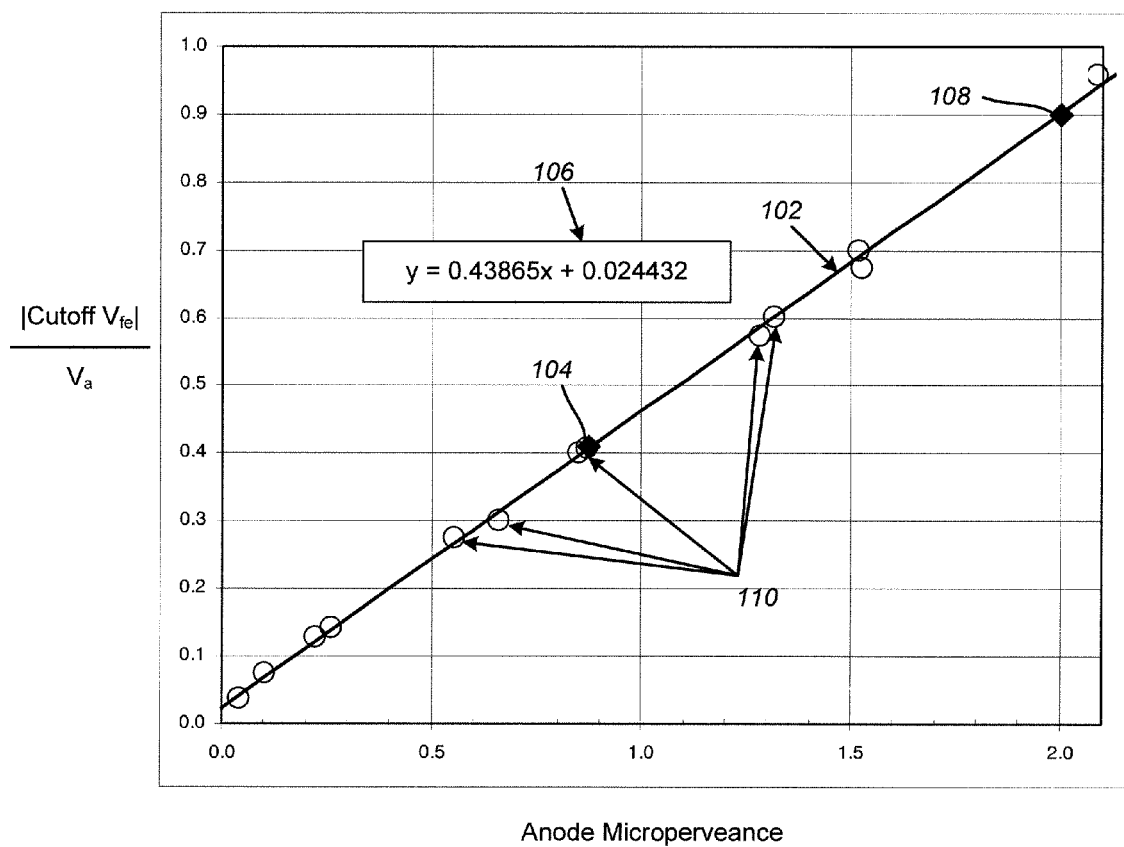
FIG. 1 is plot of normalized electron beam cutoff voltage as a function of microperveance.
Figure 2A:
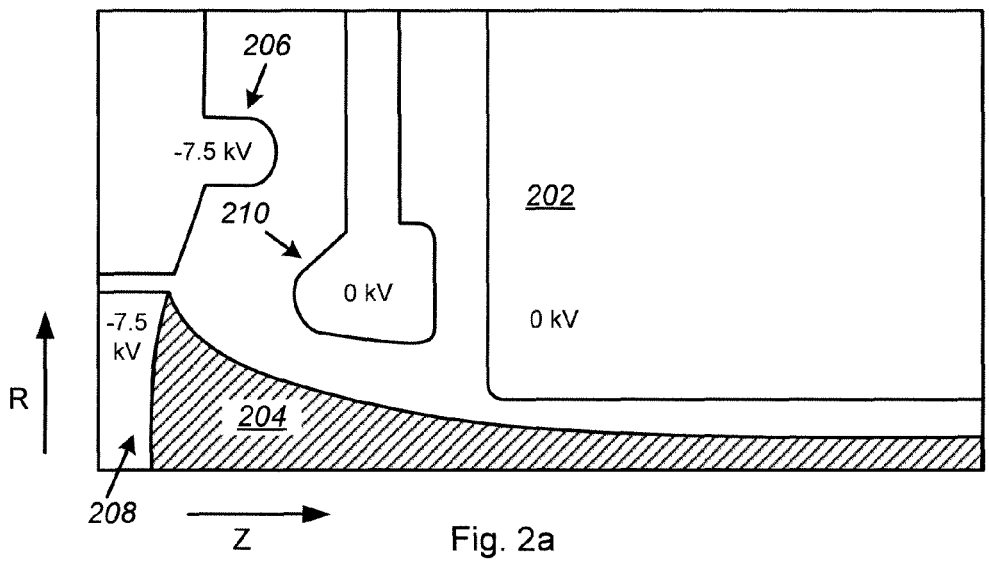
FIGS. 2a-2c depict a cross section of a 0.87 microperveance electron gun in accordance with an embodiment of the present invention.
Figure 2B:
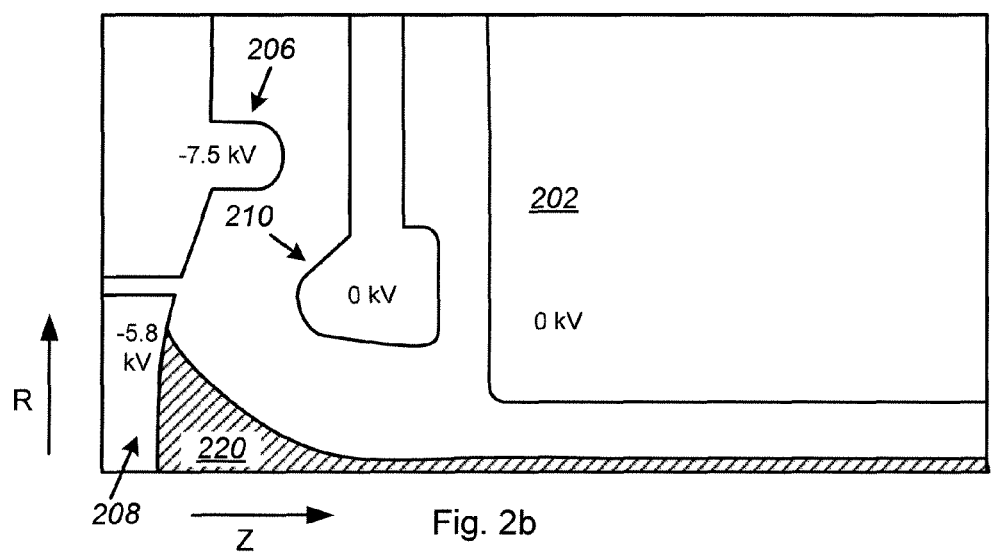
Figure 2C:
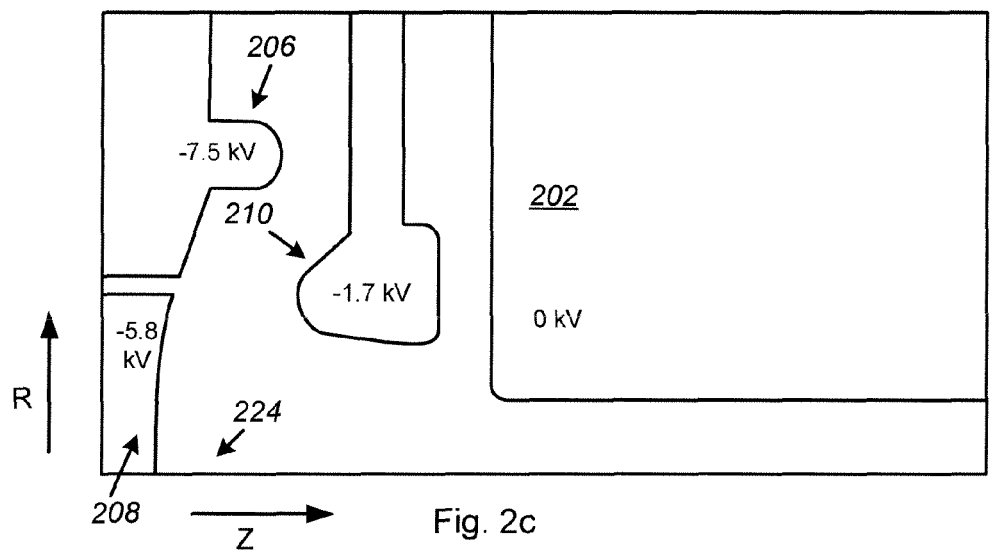

The invention provides an apparatus and method for switching voltages within a high-perveance electron gun to achieve full beam cutoff. In a preferred embodiment of an electron gun in accordance with the present invention, selective full-beam cutoff is achieved by switching both the cathode and the modulating anode voltages using two moderate-voltage switches. This switching scheme is illustrated both for a gun with a microperveance of 0.87, shown parametrically in FIG. 1 at marker 104, and for a gun with a high microperveance of 2.0, as illustrated at marker 108. FIGS. 2a-2c depict a cross section of a preferred embodiment of an electron gun in accordance with the present invention that operates with a microperveance near 0.87. Distance (Z) along the beam path is shown along the horizontal axis, and the radial distance (R) from the center of the electron beam is depicted along the vertical axis. Referring to FIG. 2a, the electron gun includes a cathode 208 that produces electrons to form an electron beam 204 that propagates within the electron gun. The electron gun also includes a focusing electrode 206, and a modulating anode 210. The cathode 208, focusing electrode 206, and modulating anode 210 are typically mounted on insulating elements (not shown) and thereby affixed to a tube body 202. In normal operation, the cathode 208 is held at a potential of −7500 volts with respect to the tube body 202, which is held at ground potential, or 0 volts. The focusing electrode 206 is held at −7500 volts, and the modulating anode 210 is held at body potential or ground. In this configuration, a large electron beam current 204 is achieved. Further, a magnetic field is typically applied within the body of the device to counteract space charge effects that can disperse the beam. Within the body of the device and under these conditions, the focused beam is generally cylindrical in shape.

It should be noted that while the focusing electrode 206 is depicted as being at the same potential as the cathode 208, it may be desirable to bias the focusing electrode 206 slightly negative with respect the cathode, for example by −10 volts or so, in order to reduce electron emission from the side of the cathode and to improve uniformity of the current density near the edge of the cathode. In addition, it may be desirable to bias the modulating anode 210 about −100 volts or so below (or +100 volts or so above) ground potential in order to adjust the current emitted from the electron gun in its normal beam-on operational mode. The basic switching principles presented herein do no preclude the application of such bias voltages; in fact, they may serve to enhance the switching methods described below.

In FIG. 2b, the effect of switching the cathode 208 toward ground by 1700 volts is shown. In this configuration, the cathode potential has been shifted to −5800 volts, meaning that there is now a potential difference of 5800 volts from the modulating anode 210 to the cathode 208. This results in a reduction in the beam current, shown schematically at 220. However, a sizeable beam current remains.

In FIG. 2c, in accordance with an embodiment of the present invention, both the cathode and the modulating anode voltages are switched by 1700 volts. The voltage of the cathode 208 is switched from −7500 volts to −5800 volts, and the voltage of the modulating anode is switched from ground to −1700 volts. This double switching operation reduces the beam current to zero or near zero, as indicated at 224.

While the cathode and the modulating anode were both described as being switched by 1700 volts in the embodiment depicted in FIG. 2c, it is not necessary to switch them symmetrically. For example, the cathode could be switched by 1900 volts and the modulating anode could be switched by −1500 volts, and a similar effect on the beam current would be produced. Systems that are switched asymmetrically, as described above, would also fall within the scope and spirit of the present invention.

Mathematically, for the system illustrated in FIGS. 2a-2c, switching just the focusing electrode by 1.7 kV creates an anode potential difference of −5.8 kV. From FIG. 1, it can be seen that at a microperveance of 0.87, cutoff voltage is approximately 0.4 times the anode voltage. Thus, multiplying by 0.4, a voltage of −2.32 kV is required for full cutoff. Since −2.32 kV has a larger magnitude than −1.7 kV, the electron beam current is not completely cut off. On the other hand, when both the cathode and anode are switched by 1.7 kV in accordance with the present invention, as illustrated in FIG. 2c, the potential difference becomes −4.1 kV. When multiplied by 0.4, this results in −1.64 kV. Because −1.64 kV is smaller in magnitude than −1.7 kV, the electron beam current is completely cut off.

Figure 3A:
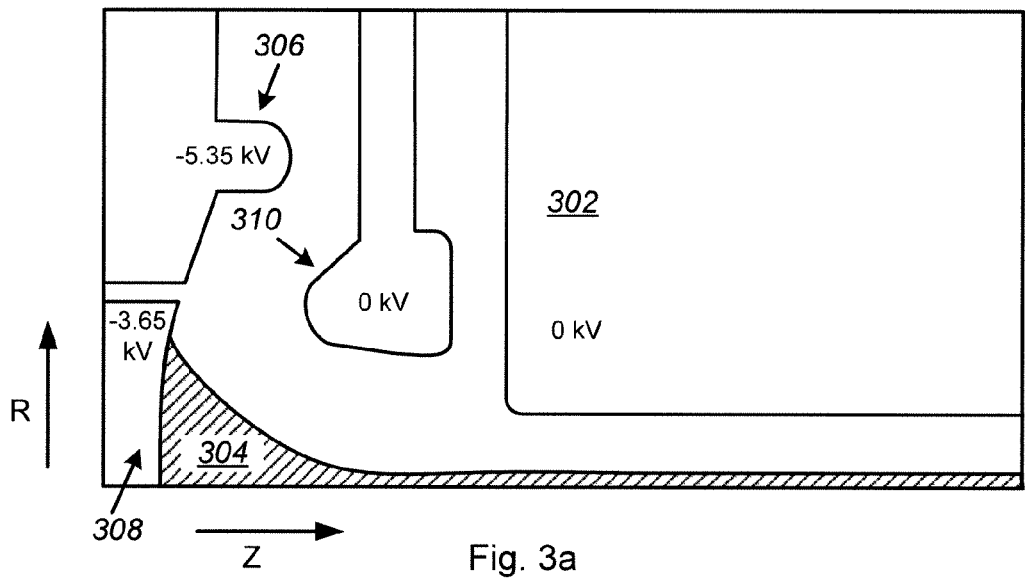
FIGS. 3a-3b depict a cross section of a 2.0 microperveance electron gun in accordance with an embodiment of the present invention.
Figure 3B:
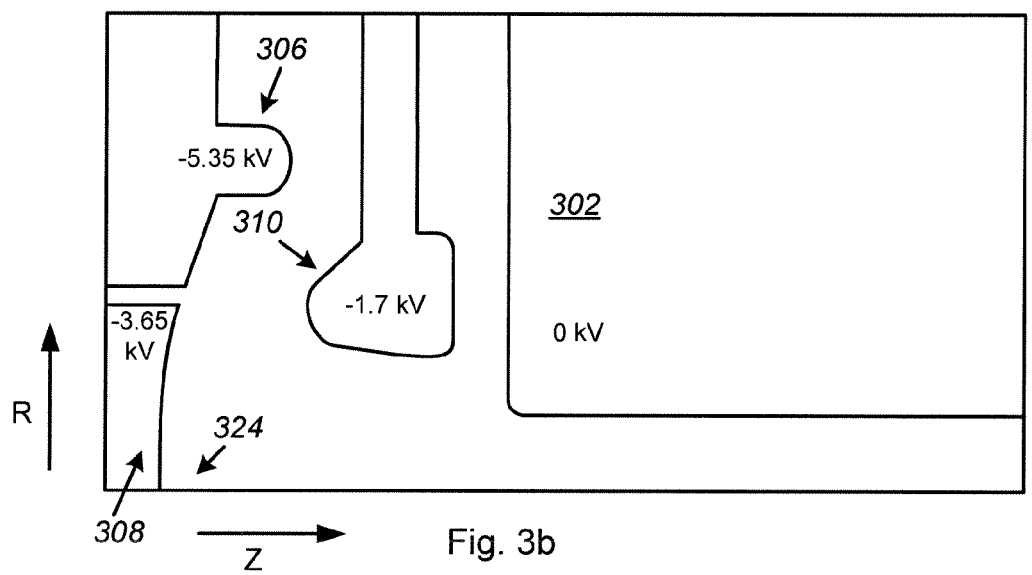

FIGS. 3a and 3b illustrate an alternative embodiment of an electron gun in accordance with the present invention for a gun with a microperveance of 2.0. In FIG. 3a, the focusing electrode 306 is at a potential of −5.35 kV, and the modulating anode 310 and body 302 are set at a potential of 0 kV. The cathode 308 is switched from −5.35 kV toward ground by 1.7 kV, as shown at 308, to create a potential difference of −3.65 kV between the cathode 308 and modulating anode 310. From FIG. 1, element 108, a gun operating at a microperveance of 2.0 requires a cutoff voltage of 91% of the cathode-to-anode voltage. Because 0.91 multiplied by −3.65 kV is −3.33 kV, which is larger in magnitude than −1.7 kV, the electron beam is not fully cut off, as illustrated at 304. However, in FIG. 3b, the modulating anode 310 is also switched by −1.7 kV, in accordance with the present invention. This creates a potential between the cathode and modulating anode of 1.95 kV. Multiplied by 0.91, this gives −1.78 kV as the cutoff voltage, which is very close to −1.7 kV, resulting in the electron beam's being nearly completely cut off, as indicated at 324.

While the embodiments depicted in FIGS. 2a-2c and 3a-3b illustrate switching of the cathode and the modulating anode, it is also possible to produce similar beam cutoff effects by switching the voltage of the focusing electrode, i.e., element 306 in FIGS. 3a and 3b. Thus, control of the electron beam current can be achieved by switching a single element, such as the cathode; by switching two elements, such as the cathode and modulating anode, or the focusing electrode and modulating anode; or by switching all three elements.

The effects of these different switching schemes can be described mathematically as follows, with reference to the elements depicted in FIG. 3a. First, consider case A, a standard electron gun control scheme whereby the cathode 308 and anode 310 are held constant, and the focusing electrode 306 is switched. As shown in FIG. 1, for a given microperveance, the ratio of the cutoff voltage, $V_{co}$, to the anode voltage, $V_a$, is constant, or $V_{co}/V_a=K$. From FIG. 1, a gun with a microperveance of 0.87 has K=0.408. In such a gun operating with the focusing electrode 306 and the cathode 308 at −7500 volts with respect to the modulating anode 310, the cutoff voltage is thus $V_{co}=K*V_a=0.408*-7500=-3060$ volts. In other words, the focusing electrode would have to be switched negative by −3060 volts with respect to cathode, or to −10,560 volts with respect to ground, in order to achieve full beam cutoff.

Next, consider case B, a single switch scheme whereby the focusing electrode 306 and the modulating anode 310 are held constant and the cathode 308 is switched. Again, we start with $V_{co}/V_a=K$. Switching the cathode voltage produces a new effective anode voltage of $V_a-V_{co}'$, where $V_{co}'$ is a new effective cutoff voltage. So $K=V_{co}'/(V_a-V_{co}')$, which can be rewritten as $K=(V_{co}'/V_a)/(1-V_{co}'/V_a)$. Then, defining K' as the new constant, such that $K'=V_{co}'/V_a$, we see that K=K'/(1"K'). Manipulating this expression to solve for K', we can see that K'=K/(1+K). From the curve of FIG. 1, we can see that a gun with a microperveance of 0.87 has K=0.408. Thus, K'=0.408/(1+0.408)=0.28977 for a cathode-switched gun. Thus, for a gun operating at a 7500 volt cathode-to-anode voltage and using cathode switching, cutoff can be achieved by switching the cathode by $V_{co}'=0.28977*7500=2173.295$ volts.

Next, consider case C, a dual-switched scheme in accordance with the present invention whereby the focusing electrode 306 is held fixed and the cathode 308 and anode 310 are both switched. In this case, the effective cathode-anode difference becomes $V_a-2V_{co}'$ because the anode and cathode are switched toward one another. Thus, $K=V_{co}'/(V_a-2V_{co}')=(V_{co}'/V_a)/(1-2V_{co}'/V_a)$. Or in other words, K=K'/(1−2K'), and solving for K' gives K'=K/(1+2K). So in this case, for a gun of microperveance 0.87 and K=0.408, K'=0.224670. For a cathode-anode difference of 7500 volts, cutoff can be achieved by switching the cathode and anode by $V_{co}'=0.224670*7500=1685.02$ volts.

Finally, consider case D, a second dual-switched scheme in accordance with the present invention whereby the cathode 308 is held constant and the focusing electrode 306 and the anode 310 are both switched. In this case, the effective cathode-anode difference is $V_a-V_{co}'$, so $K=V_{co}'/(V_a-V_{co}')$. The analysis is thus the same as for the cathode-switched case, and K'=0.408/(1+0.408)=0.28977, producing a cut-off switching voltage $V_{co}'=0.28977*7500=2173.295$ volts. While this switching voltage magnitude is higher than for case C, described above, this embodiment has the advantage of leaving the cathode voltage constant. Because the cathode draws significant current, it is much simpler to switch the focusing electrode or the modulating anode than it is to switch the cathode.

Figure 4:
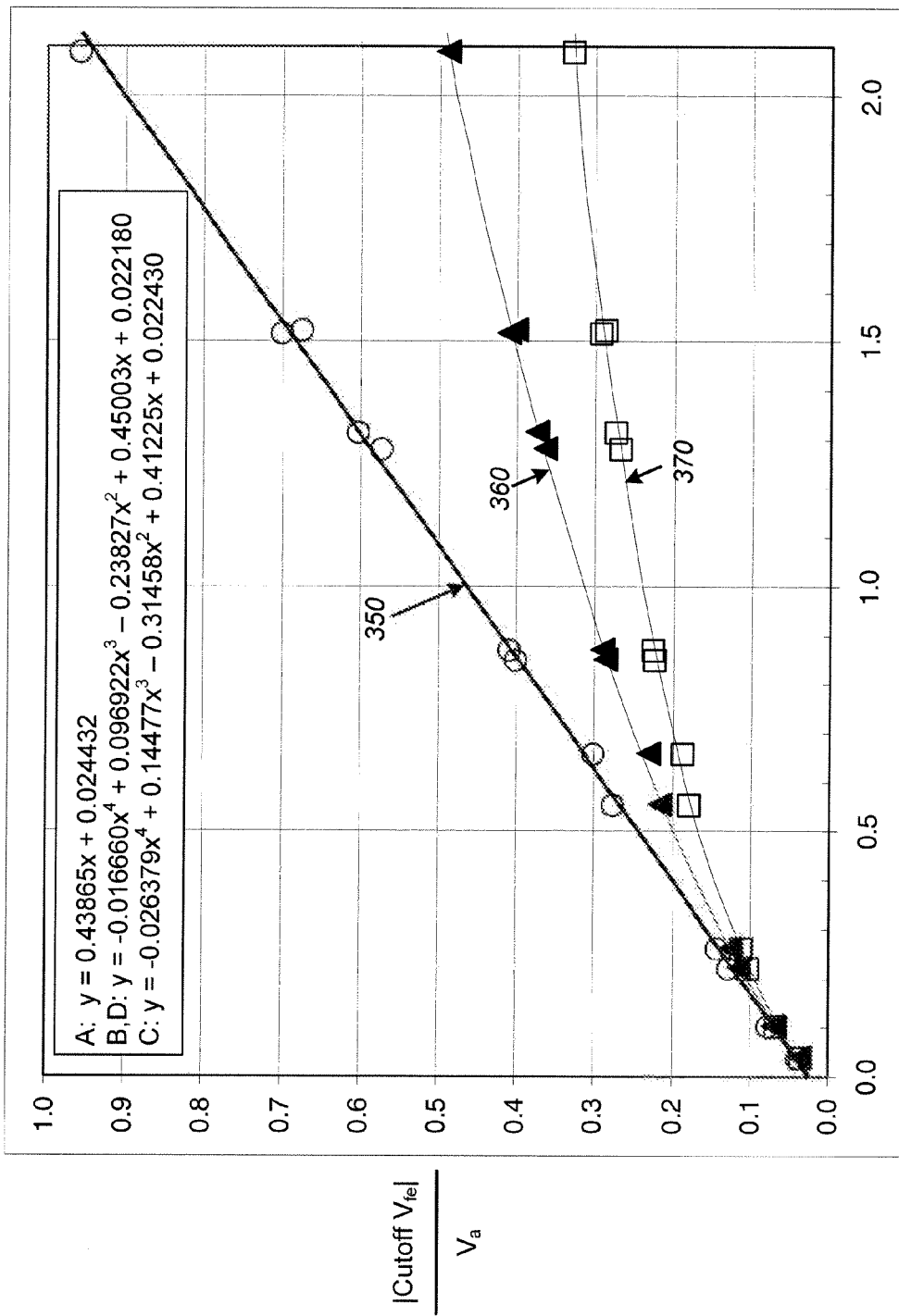
FIG. 4 is a curve summarizing beam cutoff versus microperveance for various switching schemes.

FIG. 4 is a graphical depiction of the cutoff voltage to anode voltage ratio versus the anode microperveance for cases A, B, C, and D, described above. The standard cutoff case, case A, is depicted by curve 350, corresponding to curve fit A, y=0.43865x+0.024432. Case B, the cathode-switched case, and case D, the second dual-switched case, both correspond to curve 360, which is fit to a fourth-order polynomial, $y=-0.016660x^4+0.096922x^3-0.23827x^2+0.45003x+0.022180$. Finally, case C, the first dual-switched case, corresponds to curve 370, which is also fit to a fourth-order polynomial, $y=-0.026379x^4+0.14477x^3-0.31458x^2+0.41225x+0.022430$. Using the curves in FIG. 4, the cutoff voltage ratio for an electron gun using any of the cutoff switching schemes A, B, C, or D, can be predicted for a gun of any microperveance. As can be seen from the figure, the dual switching schemes depicted at 360 and 370 become particularly advantageous for high microperveance guns, reducing the switching voltage required for cutoff by a factor of two or more over the standard switching mode 350.

Figure 5:
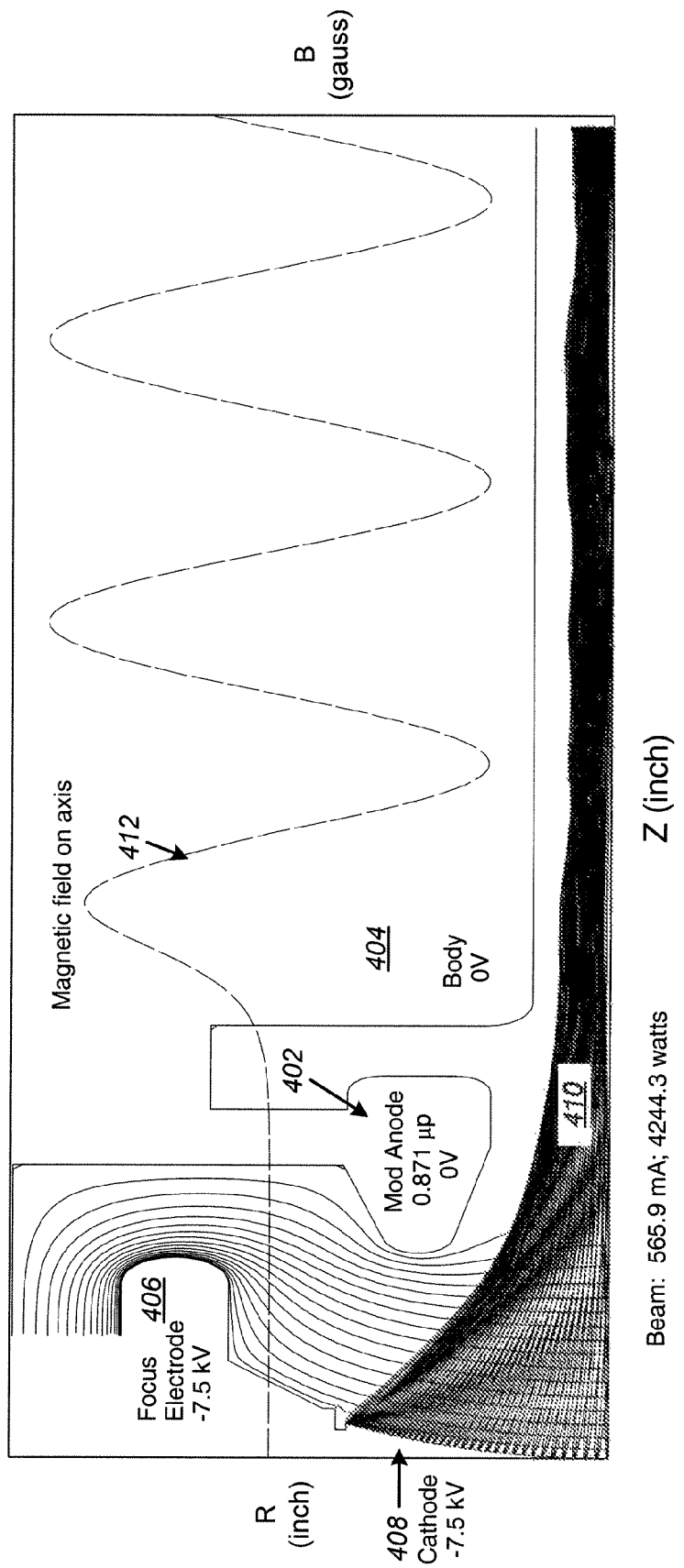
FIG. 5 illustrates the results of an electromagnetic simulation of a 0.87 microperveance electron gun in normal operation.

FIGS. 5-10 depict the results of several electromagnetic simulations using an electron transport code known as DEMEOS of an electron gun in accordance with an embodiment of the present invention. A 7500-volt electron gun is illustrated, showing that full beam cutoff can be achieved using two 1700-volt switches. FIG. 5 shows the gun during normal operation with 100% beam transmission. At a microperveance of 0.87, the cathode 408 and focusing electrode 406 are held at a potential of −7.5 kV. The modulating anode 402 and body 404 are at ground potential. The periodic permanent magnet or PPM field on axis used to focus the beam in this case is shown in the figure at 412. In actuality, the average sinusoidal field level is displaced but a small amount from zero Gauss. In this configuration, electron beam 410 is fully transmitted at a power level of 4244.3 watts and a current of 565.9 mA.

Figure 6:
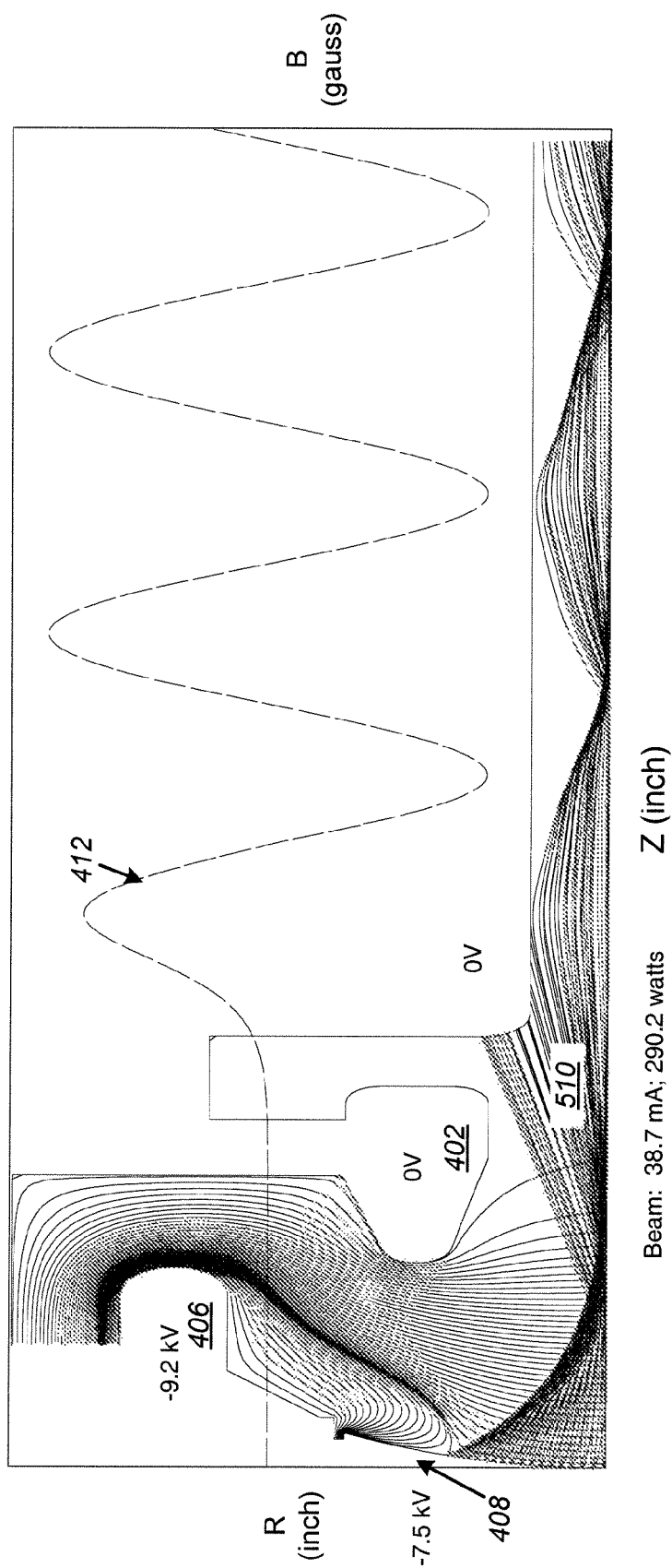
FIG. 6 illustrates a simulated attempt to cut off the electron beam current by biasing the focusing electrode more negative than the cathode.

In FIG. 6, the focusing electrode 406 is switched 1700 volts negative with respect to the cathode 408. This results in a reduction of the electron beam flux 510. The emitted beam current is approximately 39 mA, resulting in a net power in the beam of 290 watts. Since approximately 60.7% of the beam current is transmitted, net power on the body beam shaver is 114.2 watts. This may result in a heat load high enough to cause melting. The remainder of the beam current that makes its way down the travelling wave tube (TWT) or other linear beam microwave tube can provide amplification of noise, which may be unacceptable.

Figure 7:
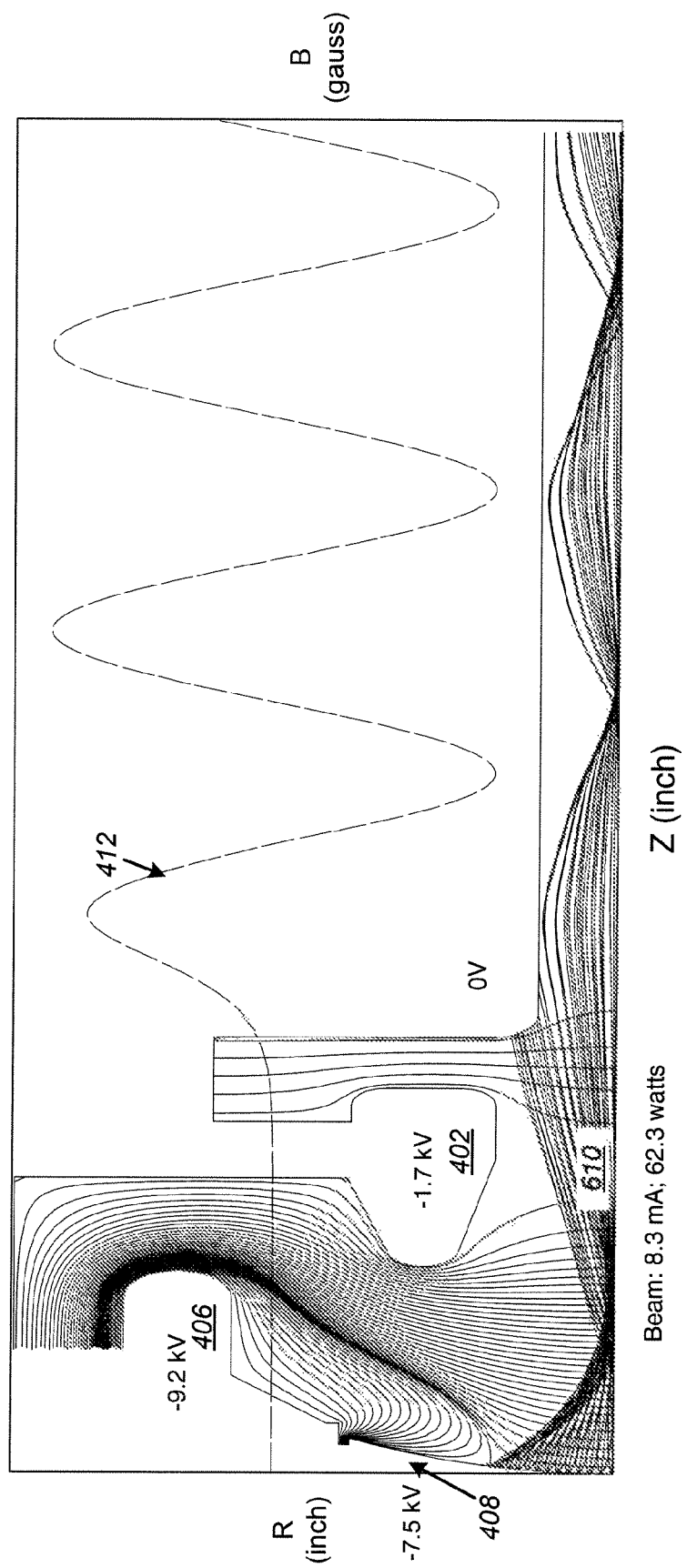
FIG. 7 illustrates a simulated attempt to cut off the electron beam current by biasing the focusing electrode negative with respect to the cathode and the anode negative with respect to ground in accordance with an embodiment of the present invention.

In FIG. 7, the focusing electrode 406 is switched 1700 volts negative with respect to the cathode 408, and the modulating anode 402 is also switched 1700 volts negative with respect to ground. Beam current and body power are both significantly lower in comparison to the case shown in FIG. 6.

Figure 12:
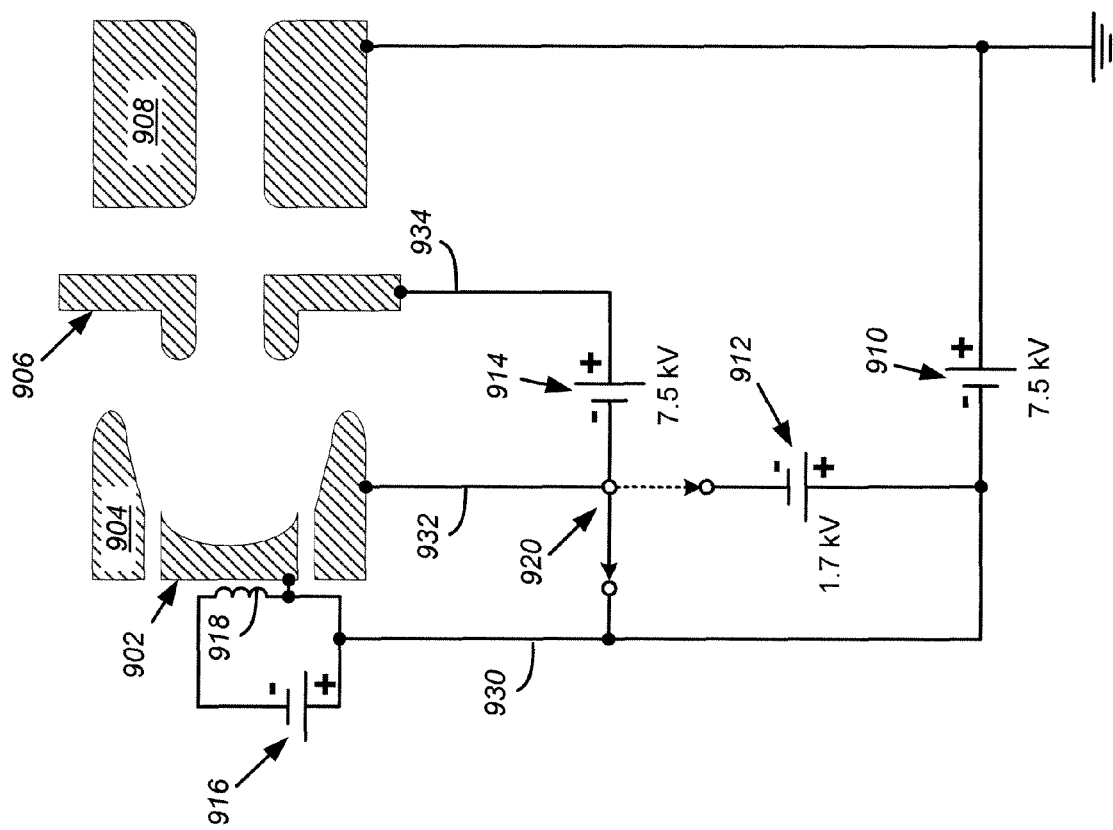
FIG. 12 depicts a simplified circuit diagram of a power supply switching circuit according to another embodiment of an electron beam tube switching a floating power supply in accordance with the present invention.

It should be noted that the voltages achieved in the system depicted in FIG. 7 can also be achieved using a single switching element. The anode 402 may be biased to +7500 volts with respect to the focusing electrode 406 using a fixed-voltage floating power supply or similar device connected between the anode 402 and the focusing electrode 406. When the focusing electrode 406 is switched to −1700 volts below the potential of the cathode 408, the voltage of the anode 402 will follow, bringing it to −1700 volts below ground. A simplified configuration implementing this scheme according to an embodiment of the present invention is depicted in FIG. 12, described further below.

Figure 8:
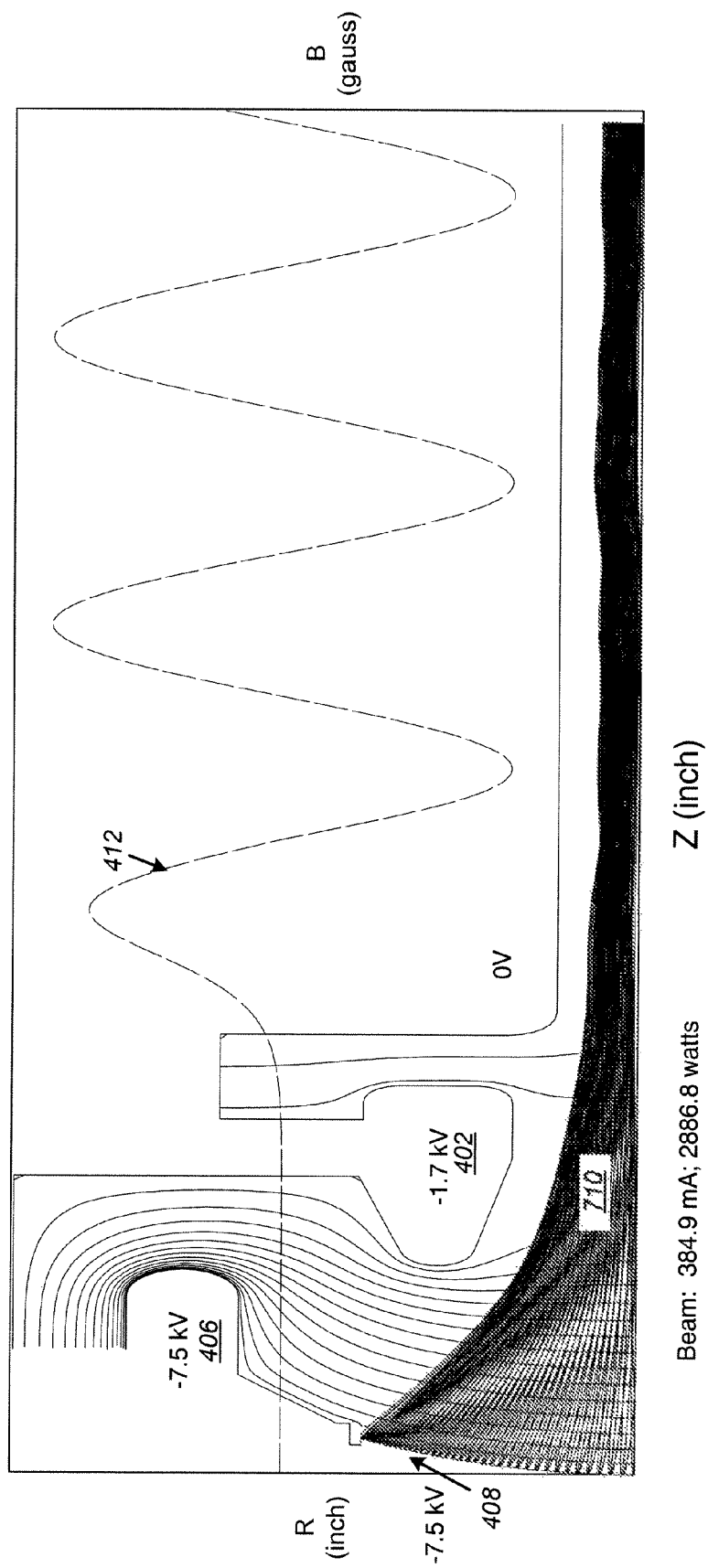
FIG. 8 illustrates the simulated effect of biasing the anode 1700 volts below ground.

In FIG. 8, only the modulating anode 402 is switched negative by 1700 volts. Beam current 710 is reduced with respect to the configuration depicted in FIG. 5 but still propagates in a stable, focused manner out of the electron gun.

Figure 9:
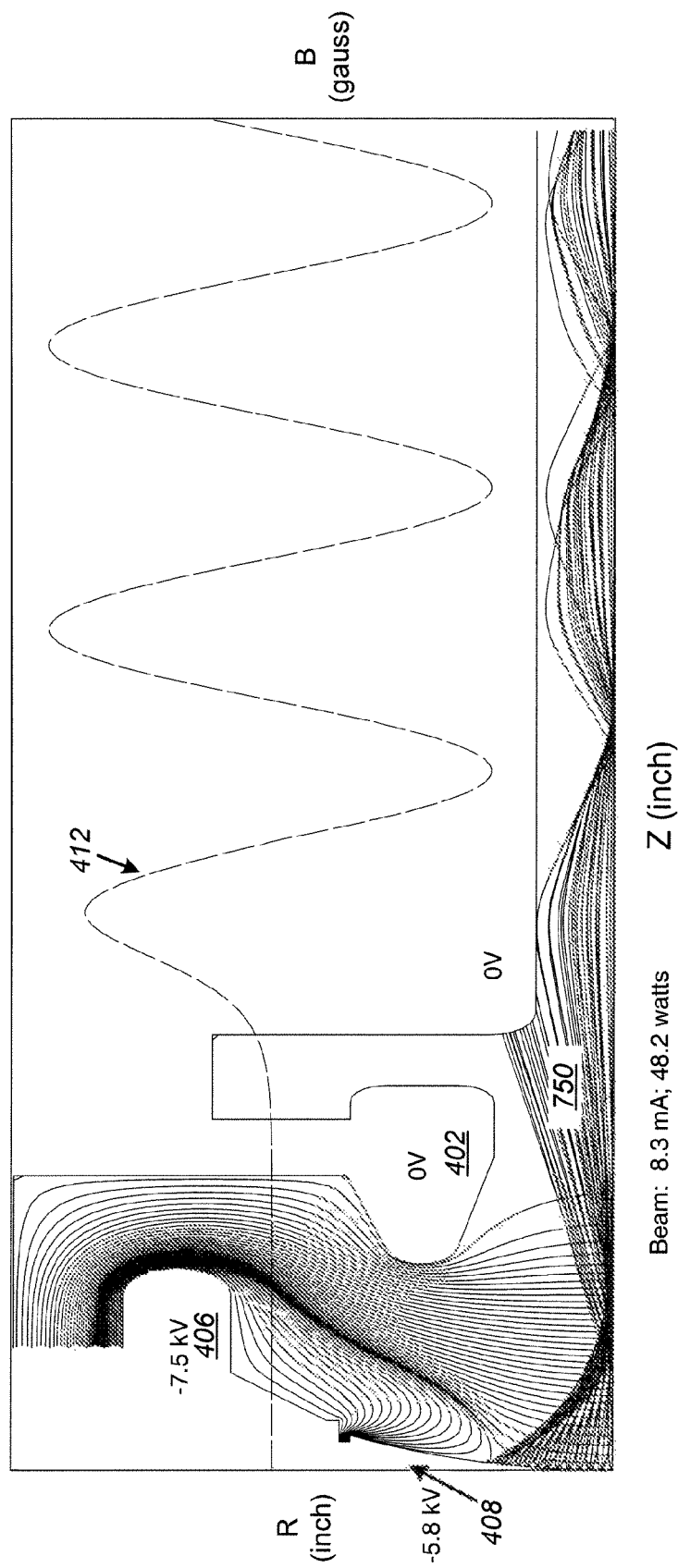
FIG. 9 illustrates the simulated effect of biasing the cathode positive by 1700 volts toward ground.

In FIG. 9, the cathode 408 is instead switched 1700 volts positive with respect to the focusing electrode 406. In this case, the emitted beam current is 8.3 mA and the net beam power is 48.2 watts. This level of current is similar to the case shown in FIG. 7. In the scheme depicted in FIG. 9, the beam transmission is 64.6%, so the power load on the power shaver is 17.1 watts. While this level of body power is not unduly high and will not cause damage to the tube, the beam current progressing through the circuit can lead to increased amplified noise that may be undesirable in certain systems.

Figure 10:
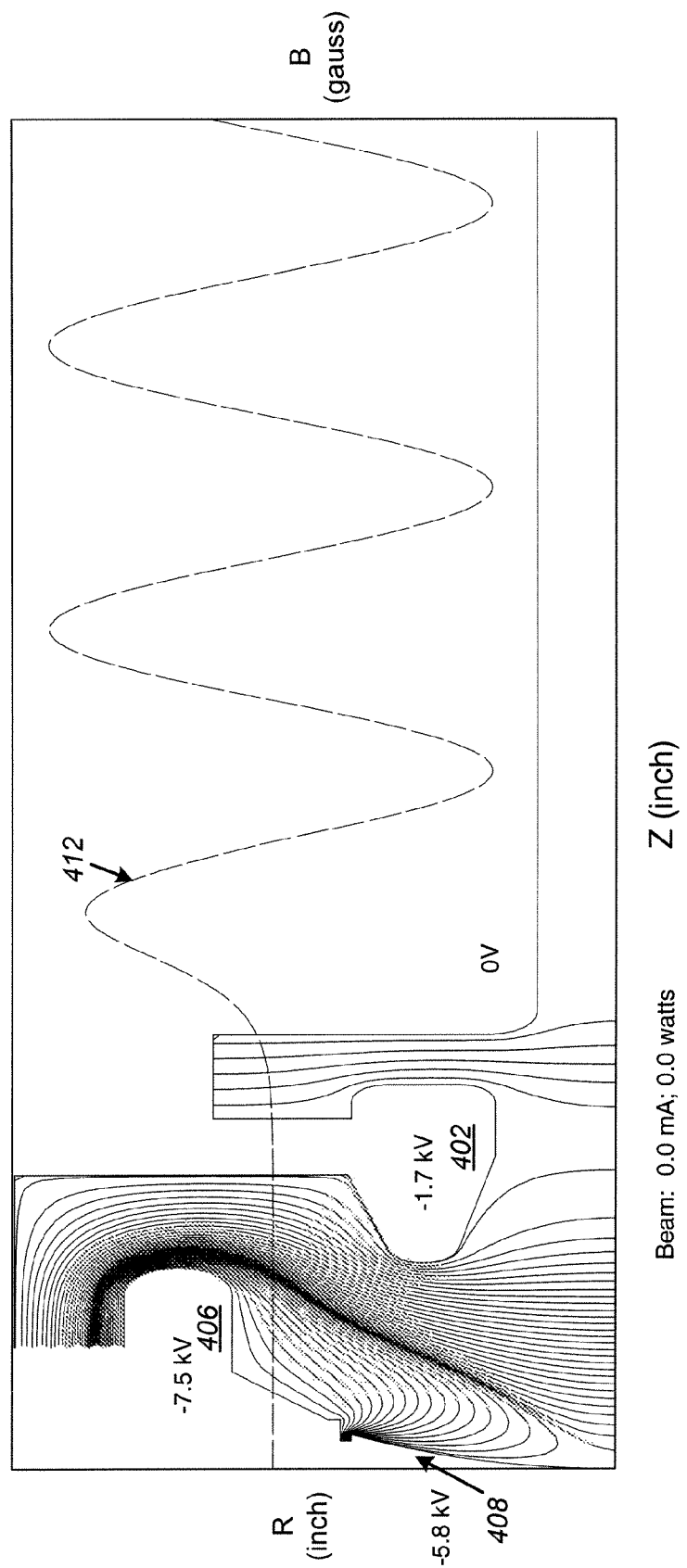
FIG. 10 illustrates that complete beam cutoff is achieved by biasing the cathode positive by 1700 volts, and the modulating anode negative by 1700 volts, in accordance with an embodiment of the present invention.

In FIG. 10, full beam cutoff is achieved by switching both the cathode and the anode by 1700 volts. Here, the cathode 408 is switched 1700 volts positive with respect to the focusing electrode 406. The anode 402 is switched to −1700 volts below ground, thus reducing the potential difference between the cathode and the anode to 4100 volts. This configuration achieves hard cutoff, as can be seen from the simulation depicted in FIG. 10. Since no beam current is emitted, there is no extra heat load on the input of the tube, and there is no beam current flowing through the circuit that can produce unwanted amplified noise.

Figure 11:
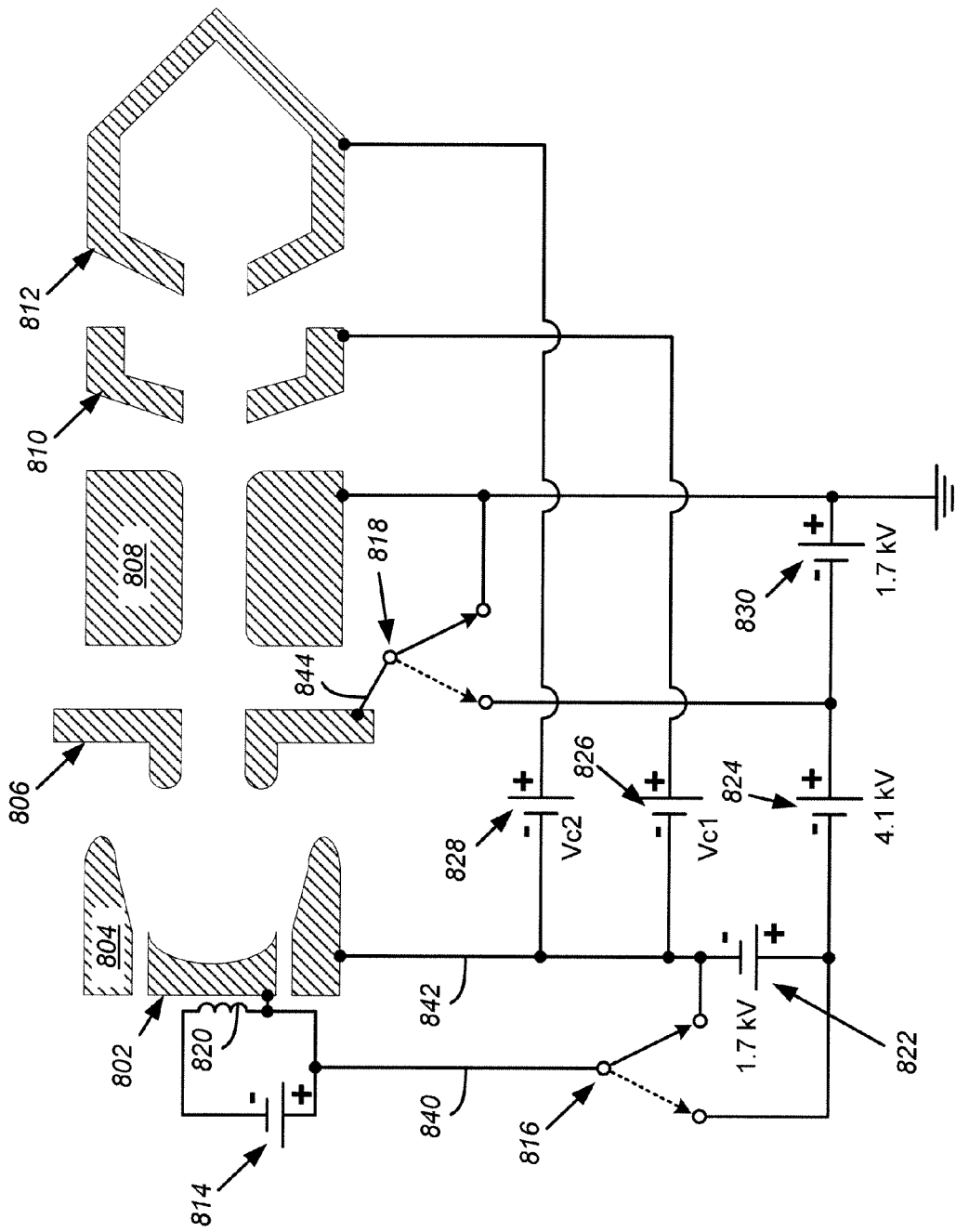
FIG. 11 depicts a simplified circuit diagram of a power supply switching circuit capable of producing cathode and modulating anode switching in accordance with an embodiment of the present invention.

FIG. 11 depicts an embodiment of an electron beam tube power supply switching circuit in accordance with the present invention that can be used to provide the dual switching function described above. The electron tube comprises a cathode 802, a focusing electrode 804, a modulating anode 806, a main body 808, and a multi-stage depressed collector unit comprising a first collector 810 and a second collector 812. Of course, collectors having a single stage or three or more individual stages may also be used. A power supply 814 is used to supply current to a cathode heater 820. Further voltage sources 822, 824, 826, 828, and 830 are used to bias various components of the electron tube. Cathode bias circuit 840 is used to supply a bias voltage to the cathode 802. Focusing electrode bias circuit 842 is used to apply a voltage bias to the focusing electrode 804, and anode bias circuit 844 is used to supply a voltage bias to anode 806. In this example, focusing electrode bias circuit 842 is fixed at −7.5 kV by series power supplies 822, 824, and 830. Also in this example, the cathode is normally at −7.5 kV, when switch 816, connected to cathode bias circuit 840, is in the position indicated by the solid arrow. By throwing the first 1700-volt switch 816 to the position indicated by the dashed arrow, the cathode voltage can be reduced in magnitude to −5.8 kV. A second 1700-volt switch 818 is connected to anode bias circuit 844 and can be used to switch a bias applied to the modulating anode from ground (solid arrow position) to −1.7 kV (dashed arrow position). The combined effect of the switching operation comprising changing the position of the two switches 816 and 818 results in a full cutoff of beam current, as described previously.

FIG. 12 is a simplified schematic drawing of another embodiment of an electron beam tube power supply switching circuit in accordance with the present invention. The electron tube includes a cathode 902, a focusing electrode 904, an anode 906, and a tube body 908. A power supply 916 supplies current to a cathode heater 918. In this embodiment, a fixed floating power supply 914 is situated between the focusing electrode 904 and the anode 906 to maintain a constant potential difference between these two components. Focusing electrode bias circuit 932 and anode bias circuit 934 are connected to the two terminals of floating power supply 914. The switching mechanism comprises a single switch 920 operatively coupled to both the focusing electrode bias circuit 932 and the anode bias circuit 934. Actuating switch 920 alternatively ties the negative terminal of the floating supply 914 to the negative terminal of the cathode power supply 910 or to the negative terminal of the 1.7 kV floating power supply 912. Thus, in normal operation, with switch 920 in the position shown by the solid arrow, the anode 906 and tube body 908 are both held at ground potential, the focusing electrode 904 is held at −7.5 kV by the cathode power supply 910, and the cathode 902 is held at −7.5 kV by the cathode power supply 910. Switch 920 can then be thrown to the position indicated by the dashed arrow, and both the anode bias circuit 934 and the focusing electrode bias circuit 932 are pulled negative by 1.7 kV by connection to the negative terminal of the 1.7 kV floating power supply 912. Thus, the anode 906 will end up at −1.7 kV and the focusing electrode 904 will move to −9.2 kV, cutting off the electron beam current, as shown previously in the simulation depicted in FIG. 7. Thus, the dual switching of the focusing electrode 904 and the anode 906 is achieved with a single switch 920. Of course, the floating power supply could also be connected between elements other than the focusing electrode and the anode depending on the desired switching configuration.

Figure 13:
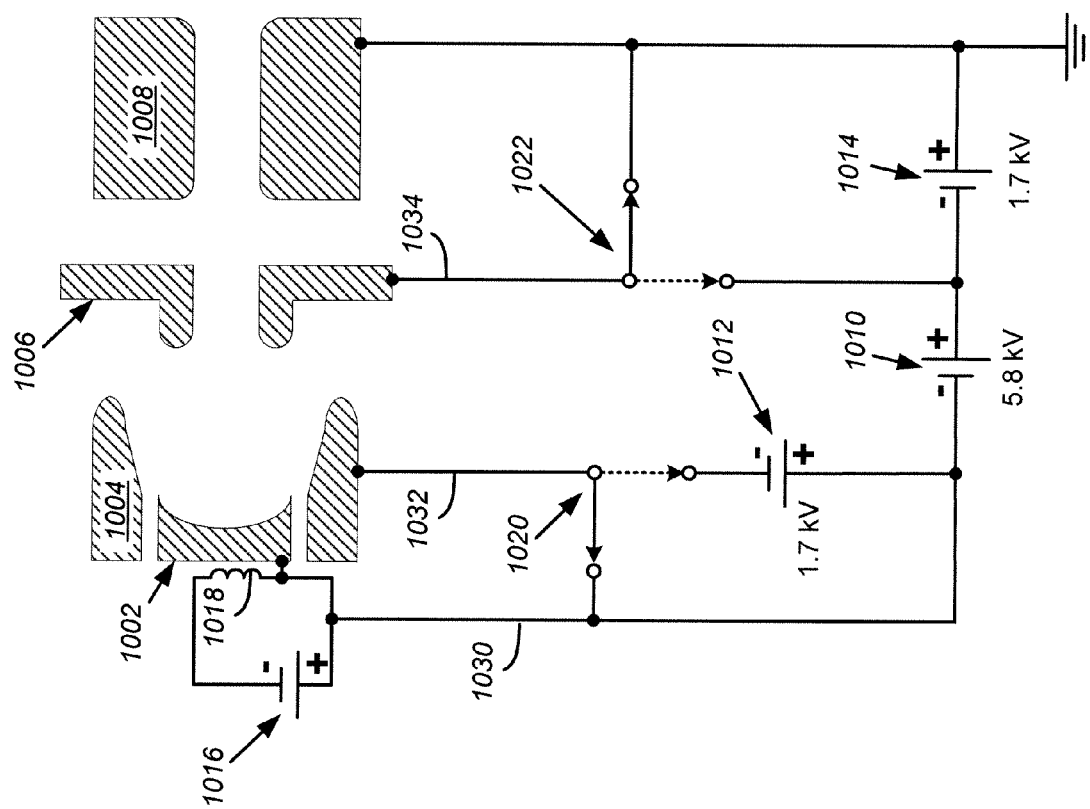
FIG. 13 depicts a simplified circuit diagram of a power supply switching circuit in accordance with another embodiment of an electron beam tube in accordance with the present invention.

FIG. 13 depicts an alternative embodiment of a power supply switching circuit for an electron beam tube in accordance with an aspect of the present invention. The figure depicts a cathode 1002 coupled to a cathode heater 1018 and cathode heater power supply 1016. The cathode 1002 is further connected to a cathode bias circuit 1030 that applies a voltage bias of −7.5 kV to the cathode via power supplies 1010 and 1014. Focusing electrode 1004 is connected to focusing electrode bias circuit 1032, which is in turn coupled to switch 1020. In its normal operating position (solid arrow), switch 1020 bypasses power supply 1012 such that the focusing electrode remains at a potential of −7.5 kV. When switch 1020 is actuated to the position shown by the dashed arrow, the bias voltage of the focusing electrode is switched to −92 kV. At the same time, the anode, which is normally held at ground potential via anode bias circuit 1034 and switch 1022 (solid arrow position), is switched to −1.7 kV by actuating switch 1022 to the position shown by the dashed arrow. This results in electron beam cutoff according to the teachings of the present invention. FIGS. 5 and 7, described previously, illustrate a simulation of the switching between these two states.

Figure 14:
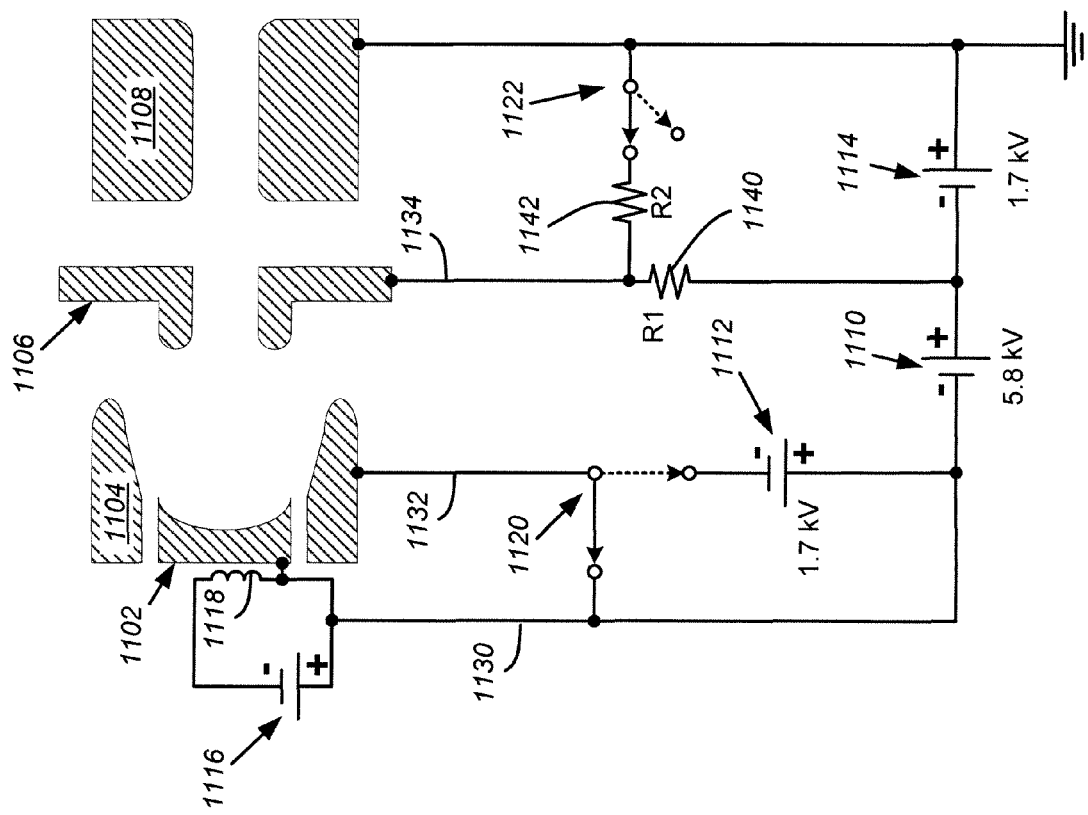
FIG. 14 depicts a simplified circuit diagram of a power supply switching circuit in accordance with yet another embodiment of an electron beam tube in accordance with the present invention.

FIG. 14 depicts an alternative embodiment of a power supply switching circuit for an electron beam tube in accordance with an aspect of the present invention. Cathode 1102 is coupled to a cathode heater 1118 and cathode heater power supply 1116. The cathode 1102 is further connected to a cathode bias circuit 1130 that applies a voltage bias of −7.5 kV to the cathode via power supplies 1110 and 1114. Focusing electrode 1104 is connected to focusing electrode bias circuit 1132, which is in turn coupled to switch 1120. In its normal operating position (solid arrow), switch 1120 bypasses power supply 1112 such that the focusing electrode remains at a potential of −7.5 kV. When switch 1120 is actuated to the position shown by the dashed arrow, the bias voltage of the focusing electrode is switched to −9.2 kV. In this embodiment, anode 1106 is connected to anode bias circuit 1134, which includes a voltage divider formed by resistors R1 (1140) and R2 (1142) connected between −1.7 kV and ground. Because the anode does not draw significant current, R1 can be selected to be a large value, such as 10 MΩ. If R2 is then selected to have a value of 0Ω, the leakage current when switch 1122 is in the normal operating position (solid arrow) is only 0.17 mA. In such a configuration, the anode 1106 is held at ground potential in normal operating mode, and when switch 1122 is opened (dashed position), the anode drops to −1.7 kV, and the leakage current drops to zero.

In more general terms, when switch 1122 is closed (solid position), the anode is set to a bias voltage given by the voltage of power supply 1114 multiplied by R2 and divided by R1+R2. For example, if R2 is selected to be 1.11 MΩ, and R1 is set at 10 MΩ, the anode bias voltage when switch 1122 is closed will be −170 V. As discussed previously, it can be desirable to bias the anode 1106 to such a voltage below ground potential in order to adjust the current emitted from the electron gun in its normal beam-on operational mode. The embodiment shown in FIG. 14 thus provides one method of achieving this goal. In normal operating mode with switch 1122 closed, the leakage current in this example would be only 0.153 mA. When a switching operation is performed that moves switches 1120 and 1122 to the position shown by the dashed arrows, the focusing electrode potential drops to −92 kV, and the anode potential drops to −1.7 kV. This cuts off the electron beam as illustrated in the simulations discussed previously with respect to FIGS. 5 and 7. Of course, the resistive divider network illustrated in FIG. 14 is merely exemplary of a design for configuring power supply switches to perform dual switching in accordance with the principles of the present invention. Other configurations would similarly fall within the scope and spirit of the present invention.

While the invention has been described in terms of various specific embodiments, these are simply meant to be illustrative of certain aspects of the invention. Other biasing and switching configurations are possible and would similarly fall within the scope of the present invention. It may also be desirable to switch all three of the cathode, anode, and focusing electrode in order to achieve electron beam cutoff. Similarly, electron guns operating at voltages other than 7.5 kV and switches that switch more or less than 1.7 kV would also fall within the scope of the present invention, as will be appreciated by those skilled in the art. The invention thus provides a novel apparatus and method for fully cutting off beam current within a high perveance electron beam tube while overcoming the difficulties of switching large-magnitude voltages. It should be clear to those skilled in the art that certain advantages of the invention have been achieved. Other advantages, applications, and modifications of the invention may also be evident to those skilled in the art and would also fall within the scope and spirit of the present invention. The invention is further defined by the following claims.

What is claimed is:

1. An electron beam tube comprising:
   a tube body;
   a cathode mechanically affixed to the tube body through an insulating element and configured to emit an electron beam comprising an operating electron beam current, wherein the cathode is connected to a cathode biasing circuit adapted to apply a bias voltage to the cathode;
   an anode affixed to the tube body through an insulating element and held in proximity to the cathode, wherein the anode is connected to an anode bias circuit adapted to apply a bias voltage to the anode;
   a focusing electrode mechanically affixed to the tube body through an insulating element and held in proximity to the cathode and the anode, wherein the focusing electrode is connected to a focusing electrode bias circuit adapted to apply a bias voltage to the focusing electrode; and
   a switching mechanism configured to change a voltage bias applied to at least two of the cathode, the anode, and the focusing electrode, such that the operating electron beam current is reduced to be substantially equal to zero;
   wherein the switching mechanism comprises a first switch that is operatively coupled to the cathode bias circuit and a second switch that is operatively coupled to the focusing electrode bias circuit, such that upon actuation of the switching mechanism, a bias voltage applied to the cathode is changed and a bias voltage applied to the focusing electrode is changed;
   wherein the switching mechanism further comprises a third switch that is operatively coupled to the anode bias circuit, such that upon actuation of the switching mechanism, a bias voltage applied to the anode is changed and a bias voltage applied to the focusing electrode is changed.

2. The electron beam tube of claim 1, wherein the switching mechanism comprises a plurality of individual switches.

3. The electron beam tube of claim 1, further comprising a floating power supply connected between two of the cathode, the anode, and the focusing electrode.

4. The electron beam tube of claim 3, wherein the floating power supply is connected between the anode and the focusing electrode.

5. The electron beam tube of claim 1, wherein the electron beam tube is further adapted to operate at a microperveance that is greater than approximately 0.8.

6. The electron beam tube of claim 1, wherein the switching mechanism upon actuation changes the voltage bias applied to the at least two of the cathode, the anode, and the focusing electrode by a magnitude that is less than approximately 2000 volts.

7. The electron beam tube of claim 1, further configured such that upon actuation of the switching mechanism, the bias voltage of the cathode is made less negative and the bias voltage of the anode is made more negative.

8. The electron beam tube of claim 1, further configured such that upon actuation of the switching mechanism, the bias voltage of the anode is made more negative and the bias voltage of the focusing electrode is made more negative.

9. The electron beam tube of claim 1, wherein the switching mechanism is configured to change a first bias voltage by a first magnitude and a second bias voltage by a second magnitude such that the first magnitude is equal to the second magnitude.

10. The electron beam tube of claim 1, wherein at least one of the cathode bias circuit, the focusing electrode bias circuit, and the anode bias circuit further includes a resistive divider network for setting a bias voltage of a corresponding one of the cathode, the focusing electrode, and the anode.

11. The electron beam tube of claim 1, further comprising a collector unit mechanically affixed to the tube body through an insulating element and configured to collect the electron beam.

12. An electron beam tube comprising:
a tube body;
a cathode mechanically affixed to the tube body through an insulating element and configured to emit an electron beam comprising an operating electron beam current, wherein the cathode is connected to a cathode biasing circuit adapted to apply a bias voltage to the cathode;
an anode affixed to the tube body through an insulating element and held in proximity to the cathode, wherein the anode is connected to an anode bias circuit adapted to apply a bias voltage to the anode;
a focusing electrode mechanically affixed to the tube body through an insulating element and held in proximity to the cathode and the anode, wherein the focusing electrode is connected to a focusing electrode bias circuit adapted to apply a bias voltage to the focusing electrode;
a switching mechanism configured to change a voltage bias applied to at least two of the cathode, the anode, and the focusing electrode, such that the operating electron beam current is reduced to be substantially equal to zero; and
a collector unit mechanically affixed to the tube body through an insulating element and configured to collect the electron beam, wherein the collector unit comprises a plurality of collector stages held at potentials that are depressed with respect to the tube body.

13. The electron beam tube of claim 12, wherein the switching mechanism comprises a plurality of individual switches.

14. The electron beam tube of claim 12, further comprising a floating power supply connected between two of the cathode, the anode, and the focusing electrode.

15. The electron beam tube of claim 14, wherein the floating power supply is connected between the anode and the focusing electrode.

16. The electron beam tube of claim 12, wherein the electron beam tube is further adapted to operate at a microperveance that is greater than approximately 0.8.

17. The electron beam tube of claim 12, wherein the switching mechanism upon actuation changes the voltage bias applied to the at least two of the cathode, the anode, and the focusing electrode by a magnitude that is less than approximately 2000 volts.

18. The electron beam tube of claim 12, wherein the switching mechanism comprises a first switch that is operatively coupled to the cathode bias circuit and a second switch that is operatively coupled to the anode bias circuit, such that upon actuation of the switching mechanism, a bias voltage applied to the cathode is changed and a bias voltage applied to the anode is changed.

19. The electron beam tube of claim 12, wherein the switching mechanism comprises a first switch that is operatively coupled to the cathode bias circuit and a second switch that is operatively coupled to the focusing electrode bias circuit, such that upon actuation of the switching mechanism, a bias voltage applied to the cathode is changed and a bias voltage applied to the focusing electrode is changed.

20. The electron beam tube of claim 12, wherein the switching mechanism comprises a first switch that is operatively coupled to the anode bias circuit and a second switch that is operatively coupled to the focusing electrode bias circuit, such that upon actuation of the switching mechanism, a bias voltage applied to the anode is changed and a bias voltage applied to the focusing electrode is changed.

21. The electron beam tube of claim 12, wherein the switching mechanism is configured to change a first bias voltage by a first magnitude and a second bias voltage by a second magnitude such that the first magnitude is equal to the second magnitude.

22. The electron beam tube of claim 12, wherein at least one of the cathode bias circuit, the focusing electrode bias circuit, and the anode bias circuit further includes a resistive divider network for setting a bias voltage of a corresponding one of the cathode, the focusing electrode, and the anode.

* * * * *